United States Patent [19]
Yu et al.

[11] Patent Number: 6,077,088
[45] Date of Patent: Jun. 20, 2000

[54] CARD BUS CONNECTOR

[75] Inventors: Hung-Chi Yu; Min-Fang Wu, both of Taipei Hsien, Taiwan

[73] Assignee: Hon Hai Precision Ind. Co., Ltd., Taipei Hsien, Taiwan

[21] Appl. No.: 09/156,343

[22] Filed: Sep. 18, 1998

[30] Foreign Application Priority Data

Sep. 18, 1997 [TW] Taiwan ................................. 86216022

[51] Int. Cl.7 ................................................... H01R 12/00
[52] U.S. Cl. ............................ 439/64; 439/108; 439/607; 361/737; 361/799
[58] Field of Search ............................... 439/64, 92, 108, 439/607, 159, 160, 946; 361/737, 799

[56] References Cited

U.S. PATENT DOCUMENTS

| | | | |
|---|---|---|---|
| 5,286,214 | 2/1994 | Takahashi | 439/92 |
| 5,588,850 | 12/1996 | Pan et al. | 439/92 |
| 5,807,137 | 9/1998 | Janota et al. | 439/946 |
| 5,906,516 | 5/1999 | Sato et al. | 439/946 |
| 5,934,915 | 8/1999 | Henningsson et al. | 439/92 |

*Primary Examiner*—Paula Bradley
*Assistant Examiner*—Katrina Davis

[57] ABSTRACT

A card bus connector includes an insulative housing having a connecting portion and a pair of receiving arms extending from distal ends of the connecting portion, a plurality of contact terminals received in passageways defined through the connecting portion, a metal strip received in a guiding groove of each receiving arm for contacting with metal covers of an inserted I/O card, and a grounding plate firmly positioned between the connecting portion and the retaining arms. Metal standoffs extending downward from four corners of the housing contact grounding traces formed on a PCB thereby providing a first grounding path from an I/O card inserted in the card bus connector. The grounding plate also contacts grounding traces formed on the PCB thereby providing a second grounding path from an I/O card inserted in the card bus connector.

6 Claims, 7 Drawing Sheets

CARD BUS CONNECTOR

BACKGROUND OF THE INVENTION

1. Field of the Invention

The present invention relates to a card bus connector, and particularly to a card bus connector which facilitates electrostatic discharge from an inserted input/output card to grounding traces on a printed circuit board on which the card bus connector is mounted.

2. The Prior Art

Portable computers equipped with card bus connectors for receiving input/output (I/O) cards inserted therein which expand the function of the computer have become dominating products in the market. The card bus connector is mounted on a printed circuit board (PCB) of the computer and the I/O card has metallic covers. A good grounding path must be provided between the I/O card and the PCB so that when the I/O card is inserted into the card bus connector electrostatic charges accumulated on the metallic covers of the I/O card can be discharged therethrough. If an adequate grounding path is not provided, the excessive noise resulting from the accumulated charges on the I/O card will interfere with the signal transmission between the card and the computer system.

Referring to FIGS. 1 and 2, a conventional card bus connector 14 includes a pair of guiding arms 16 each including a metal strip 18 and a pair of metallic standoffs 20 for providing a grounding path from metallic covers 12 (only one shown) of an inserted I/O card 10 to a PCB 22 on which the card bus connector 14 is mounted. However, the speed of electrostatic discharge is hindered by the limited number of standoffs 20 which may adversely affect signal transmission between the I/O card 10 and the card bus connector 14 especially during high speed signal transmission.

Hence, an improved card bus connector is needed to improve the electrostatic discharge capabilities of conventional card bus connectors.

SUMMARY OF THE INVENTION

Accordingly, an objective of the present invention is to provide a card bus connector which provides multiple grounding paths from an inserted I/O card to a PCB upon which the card bus connector is mounted for increasing the speed of electrostatic discharge from metallic covers of the I/O card to grounding traces formed on the PCB.

To fulfill the above mentioned objective, a card bus connector in accordance with the present invention includes an insulative housing having a connecting portion and a pair of receiving arms extending from distal ends of the connecting portion, a plurality of contact terminals received in passageways defined through the connecting portion, a metal strip received in a guiding groove of each receiving arm for contacting metal covers of an inserted I/O card, and a grounding plate firmly positioned between the connecting portion and the retaining arms. Metal standoffs extending downward from four corners of the housing contact grounding traces formed on a PCB thereby providing a first grounding path from the I/O card inserted in the card bus connector. The grounding plate also contacts grounding traces formed on the PCB thereby providing a second grounding path from the I/O card inserted in the card bus connector.

DETAILED DESCRIPTION OF THE PREFERRED EMBODIMENT

Reference will now be made in detail to the preferred embodiments of the present invention. It is noted that like parts are designated by like numerals throughout the description of the preferred embodiments.

Figure 1:
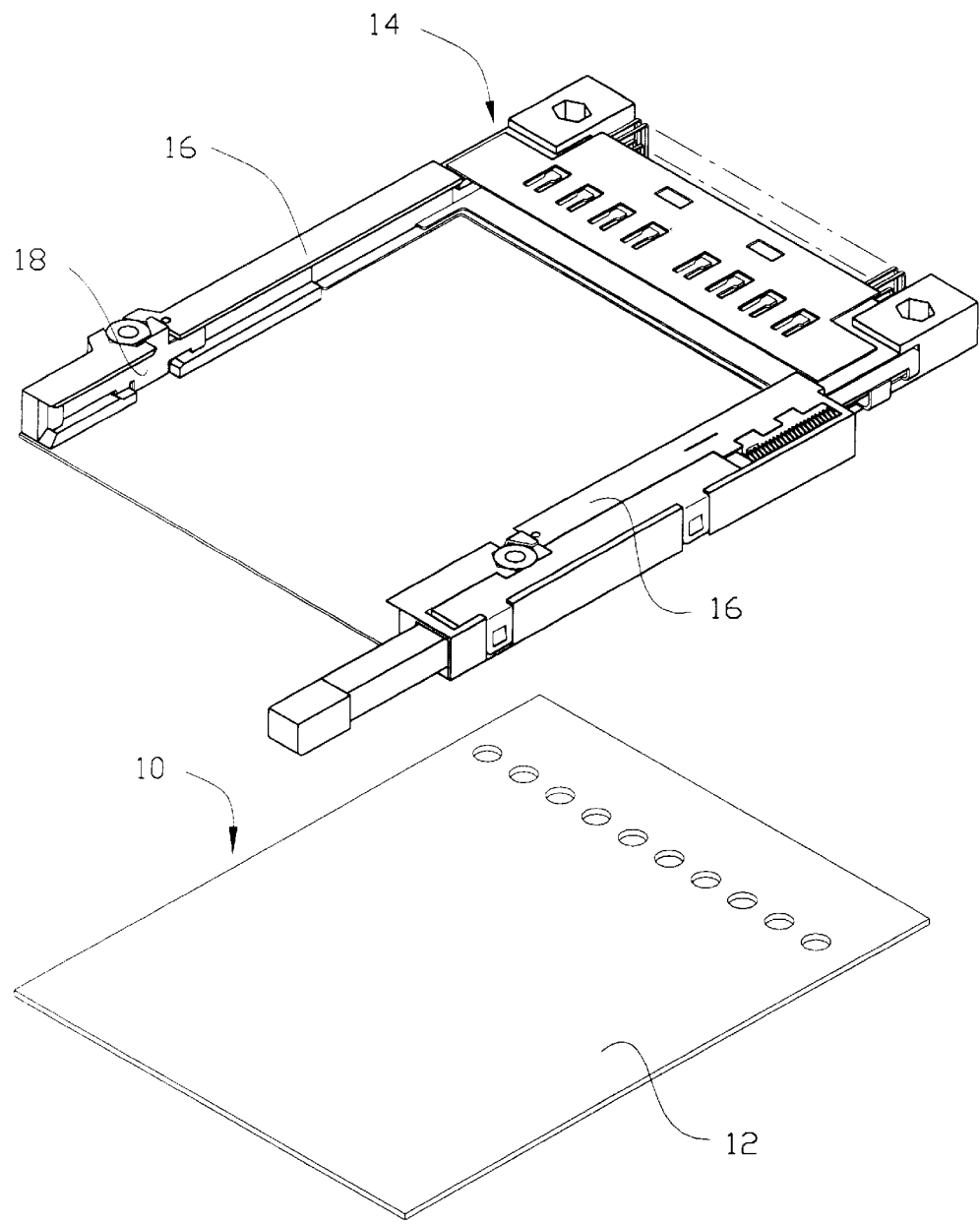
FIG. 1 is a perspective view showing a conventional card bus connector and a metal cover of an I/O card to be received therein.
Figure 2:
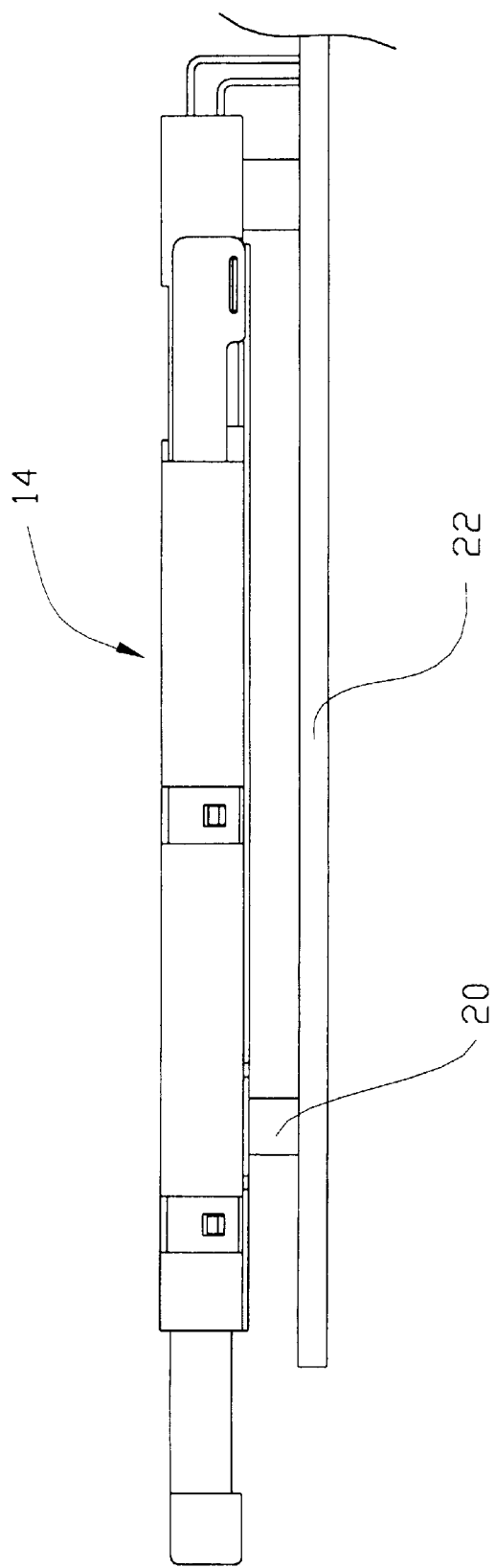
FIG. 2 is a side view of the conventional card bus connector of FIG. 1 attached to a printed circuit board.
Figure 3:
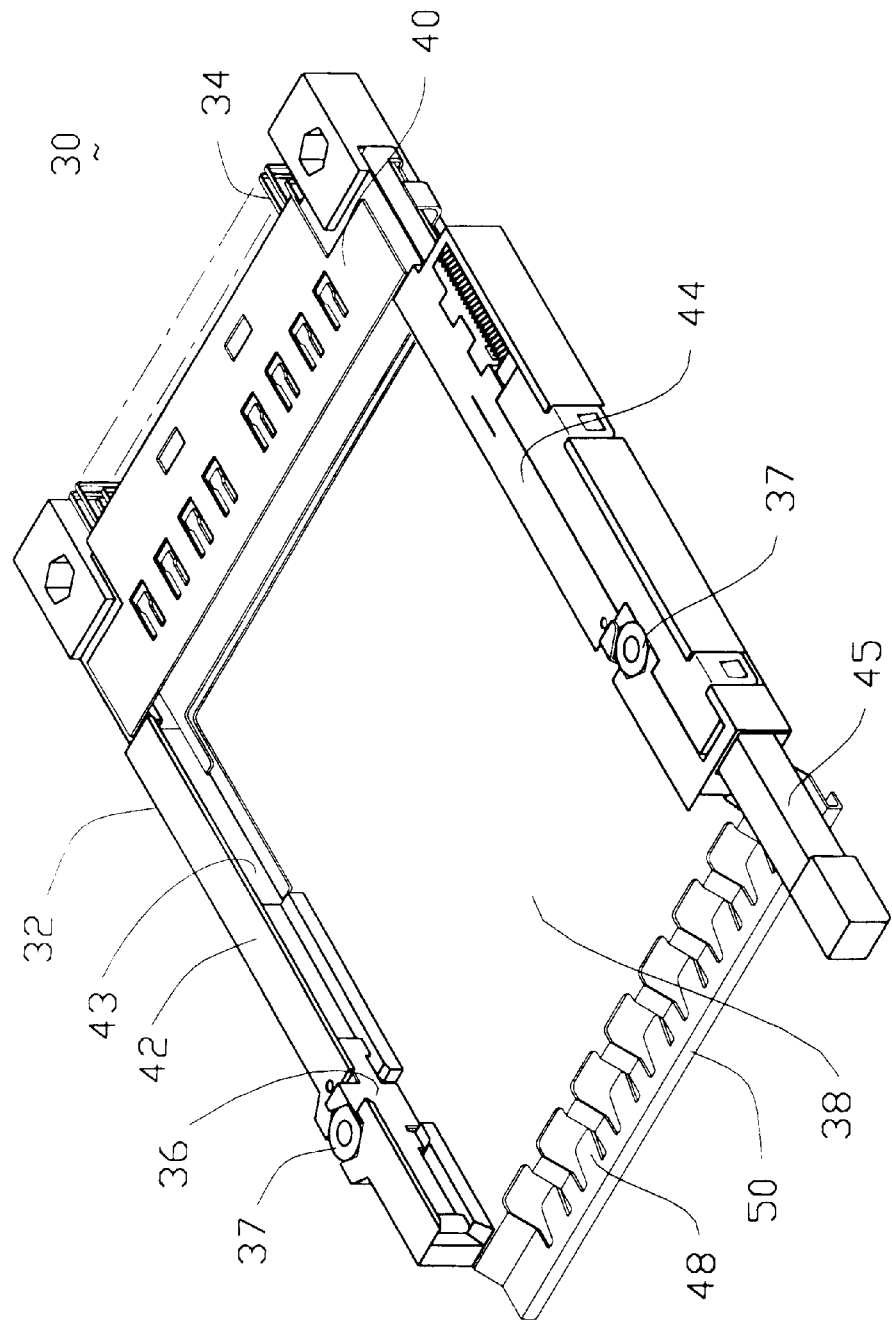
FIG. 3 is a perspective view of an assembled card bus connector in accordance with a first embodiment of the present invention.
Figure 4:
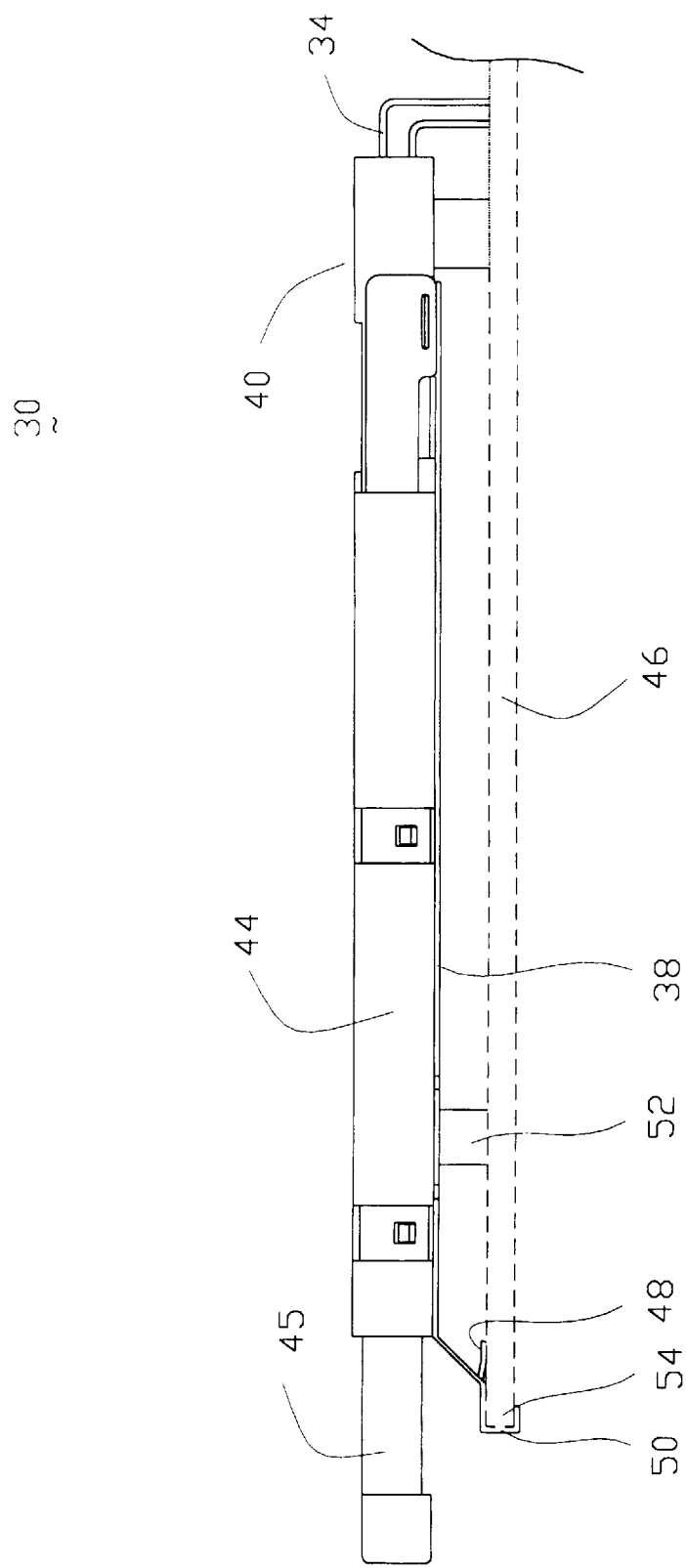
FIG. 4 is a side view of FIG. 3 showing how a grounding plate of the card bus connector engages with a PCB.

Referring to FIGS. 3 and 4, a card bus connector 30 in accordance with a first embodiment of the present invention includes an insulative housing 32 having a connecting portion 40 and a pair of receiving arms 42, 44 extending from distal ends of the connecting portion 40, a plurality of contact terminals 34 received in passageways defined through the connecting portion 40, a metal strip 36 received in a guiding groove 43 of each receiving arm 42, 44 for contacting metal covers of an inserted I/O card (not shown), and a grounding plate 38 firmly positioned between the connecting portion 40 and the retaining arms 42, 44.

The metal strips 36 are securely fixed to the receiving arms 42, 44 by a pair of rivets 37. A push rod 45 for actuating an ejector mechanism (not shown) of the card bus connector 30 is disposed in one of the receiving arms 44. Metal standoffs 52 extending downward from four corners of the housing 32 contact grounding traces (not shown) formed on a PCB 46 thereby providing a first grounding path from an I/O card inserted in the card bus connector 30. The grounding plate 38 forms a number of grounding portions 48 and a U-shaped retaining portion 50 along a front portion thereof. The grounding portions 48 also contact grounding traces formed on the PCB 46 thereby providing a second grounding path from an I/O card inserted in the card bus connector 30, and the retaining portion 50 snugly receives an edge 54 of the PCB 46 therein for increasing the retention strength of the card bus connector 30 thereon.

Figure 5:
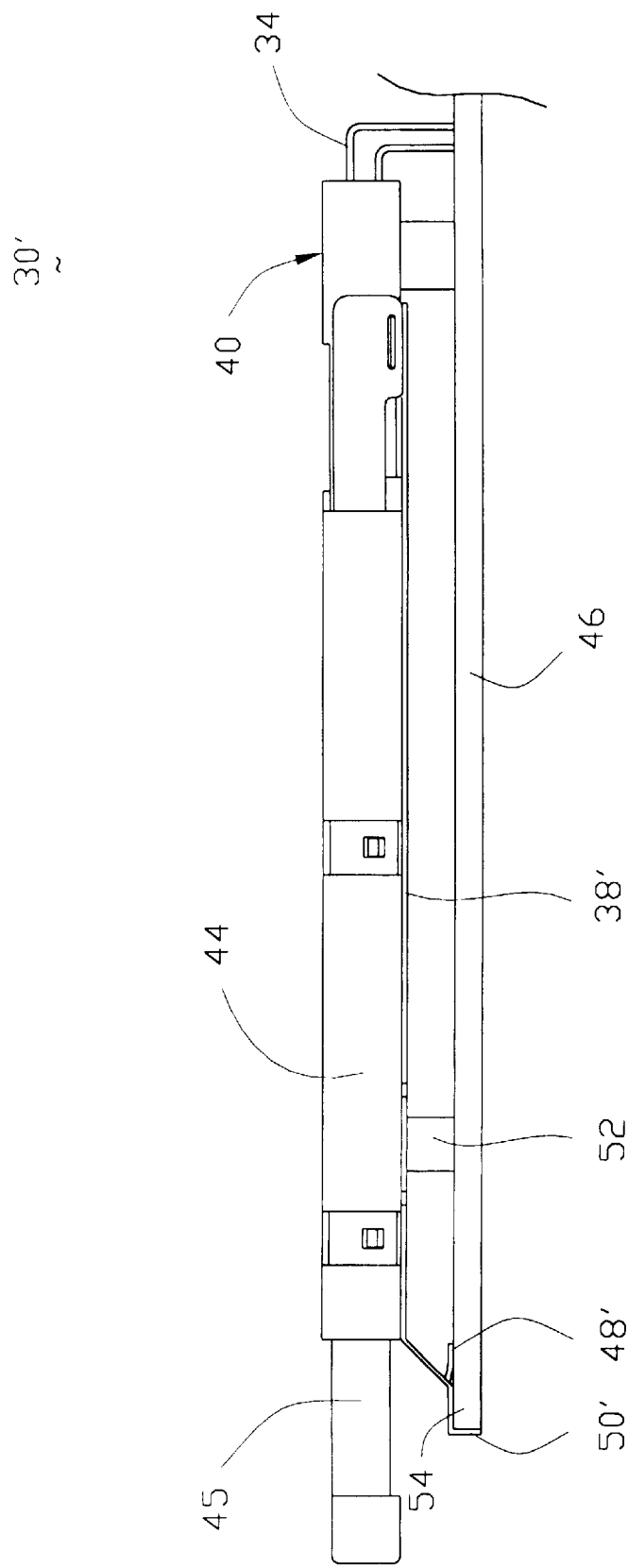
FIG. 5 is a side view of a card bus connector in accordance with a second embodiment of the present invention showing how a grounding plate of the card bus connector engages with a PCB.

Referring to FIG. 5, a card bus connector 30' in accordance with a second embodiment of the present invention is essentially the same as the first embodiment except that a grounding plate 38' forms an L-shaped retaining portion 50' along a front portion thereof. Grounding portions 48' contact with the grounding traces formed on the PCB 46 and the retaining portion 50' abuts against the edge 54 of the PCB 46.

Figure 6:
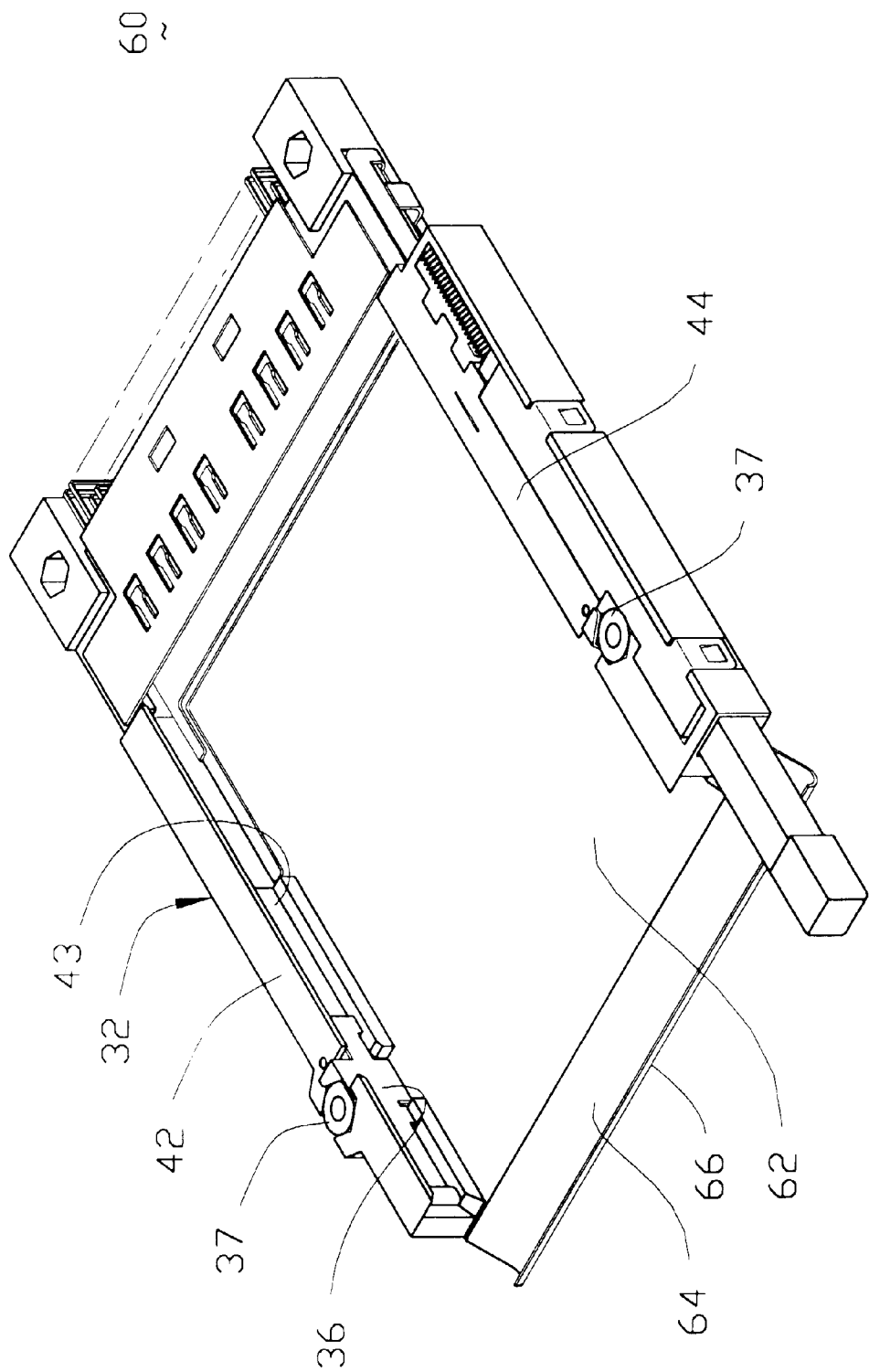
FIG. 6 is a perspective view of an assembled card bus connector in accordance with a third embodiment of the present invention.
Figure 7:
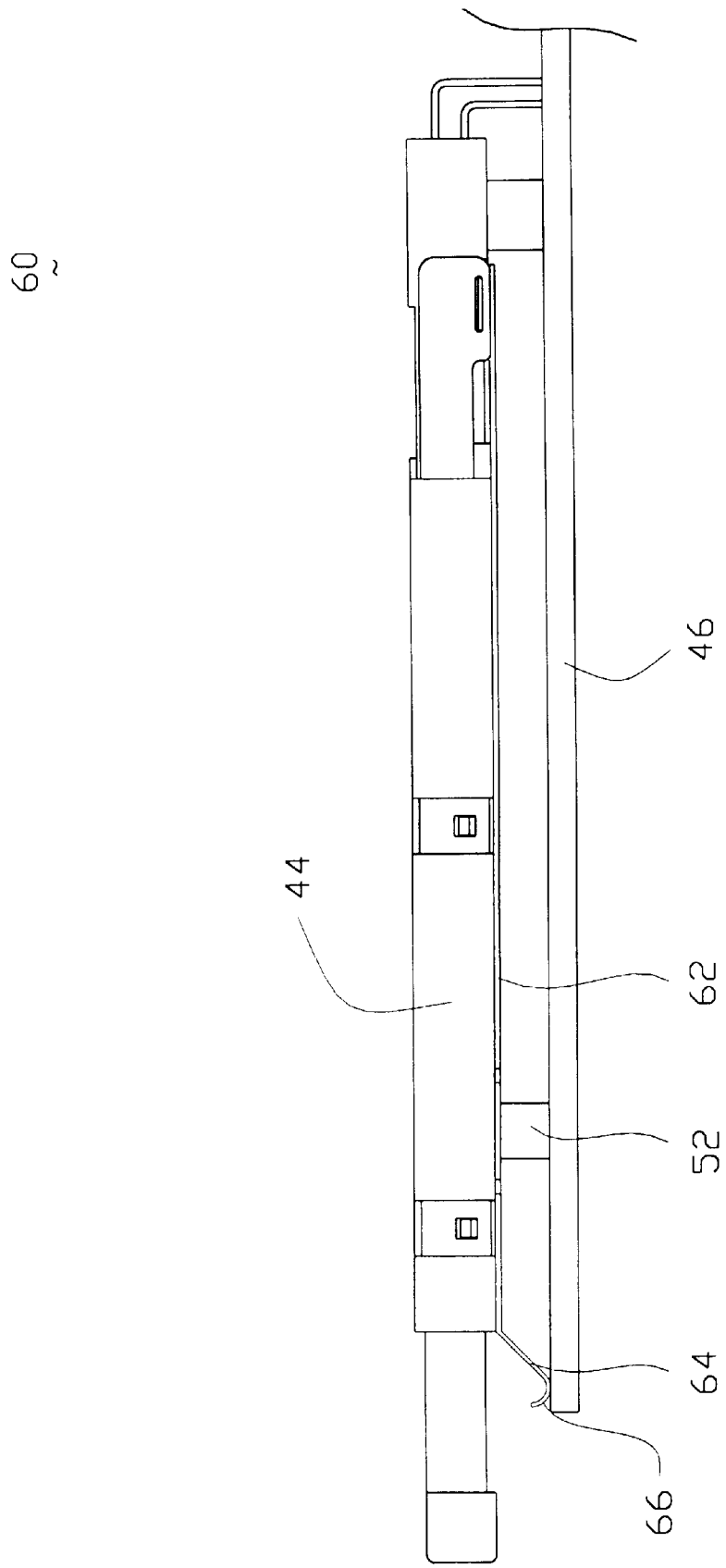
FIG. 7 is a side view of the card bus connector of FIG. 6 showing how a grounding plate of the card bus connector engages with a PCB.

Referring to FIGS. 6 and 7, a card bus connector 60 in accordance with a third embodiment of the present invention is essentially similar to the first embodiment except that a grounding plate 62 has a front portion 64 sloping downward and forming a curved edge 66 contacting the grounding traces formed on the PCB 46.

The second grounding path from the inserted I/O card to the grounding traces of the PCB through the grounding plate, in addition to the first grounding path through the metal standoffs, greatly increases the speed of electrostatic discharge of the metal covers of the I/O card.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

What is claimed is:

1. A card bus connector for being mounted on a printed circuit board (PCB) having a plurality of grounding traces thereon, comprising;

an insulative housing having a connecting portion and a pair of receiving arms extending from distal ends of the connecting portion, each receiving arm defining a guiding groove therein;

a plurality of contact terminals received in passageways defined through the connecting portion;

a metal strip received in each guiding groove of each receiving arm of the housing for contacting a metal cover of an inserted electrical card; and a grounding plate firmly positioned between the connecting portion and the receiving arms of the housing and electrically contacting said metal strips, the grounding plate having a front portion directly contacting the grounding traces of the printed circuit board thereby forming a grounding path which electrically connects the inserted electrical card to the grounding traces via said metal strips, the front portion of the grounding plate is located adjacent to an insertion entrance of the inserted electrical card in the connector and forms a number of grounding portions and a talon-like retaining portion along the front portion thereof the front portion of the grounding plate slopes downward and forms a curved edge which contacts the grounding traces of the printed circuit board the grounding plate is located between the inserted electrical card and the printed circuit board and the grounding portions contacting the grounding traces of the printed circuit board and retaining portions snugly engaging an edge of the printed circuit board for increasing the retention strength of the card bus connector thereon portions.

2. The card bus connector as described in claim 1, wherein the retaining portion of the grounding plate is U-shaped for snugly receiving the edge of the PCB.

3. The card bus connector as described in claim 1, wherein the retaining portion of the grounding plate is L-shaped for abutting against the edge of the PCB.

4. A card connector assembly, comprising:

a printed circuit board with a plurality of first and second grounding traces formed thereon; and a card bus connector mounted on the printed circuit board, including:

an insulative housing having a connecting portion and a pair of receiving arms extending from distal ends of the connecting portion, each receiving arms extending from distal ends of the connecting portion, each receiving arm defining a guidance groove therein;

a plurality of contact terminals received in passageways defined through the connecting portion;

at least a metal strip disposed within corresponding guiding groove of said housing for contacting metal covers of an inserted electrical card;

a number of metal standoffs extending from a bottom surface of the housing and electrically connecting the first grounding traces of the printed circuit board and said metal strip thereby forming a first grounding path; and a grounding plate firmly positioned among the connecting portion and the pair of receiving arms of the housing and electrically contacting said at least one metal strip, the grounding plate having a front portion electrically connecting the second grounding traces of the printed circuit board with said at least one metal strip thereby forming a second grounding path, the front portion of the grounding plate directly contacts the number of metal standoffs and forms a number of grounding portions and a talon-like retaining portion along the front portion thereof, the grounding portions contacting the grounding traces of the printed circuit broad and a retaining portion snugly receiving an edge of the printed circuit board therein for increasing the retention strength of the card bus connection thereon the front portion of the grounding plate slopes downward and forms a curved edge which contacts the second grounding traces of the printed circuit board.

5. The card connector assembly as described in claim 4, wherein the retaining portion of the grounding plate is U-shaped for snugly receiving the edge of the PCB.

6. The card connector assembly as described in claim 4, wherein the retaining portion of the grounding plate is L-shaped for abutting against the edge of the PCB.

* * * * *